(12) United States Patent
Moriuchi

(10) Patent No.: US 11,399,431 B2
(45) Date of Patent: Jul. 26, 2022

(54) LAND FOR SURFACE MOUNTED COMPONENT

(71) Applicant: SONY CORPORATION, Tokyo (JP)

(72) Inventor: Norikimi Moriuchi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 17/250,632

(22) PCT Filed: Aug. 16, 2019

(86) PCT No.: PCT/JP2019/032198
§ 371 (c)(1),
(2) Date: Feb. 12, 2021

(87) PCT Pub. No.: WO2020/040067
PCT Pub. Date: Feb. 27, 2020

(65) Prior Publication Data
US 2021/0307166 A1 Sep. 30, 2021

(30) Foreign Application Priority Data

Aug. 24, 2018 (JP) .............................. JP2018-157693

(51) Int. Cl.
*H05K 1/11* (2006.01)
*H05K 3/34* (2006.01)

(52) U.S. Cl.
CPC ............ *H05K 1/111* (2013.01); *H05K 3/3442* (2013.01); *H05K 2201/09381* (2013.01);
(Continued)

(58) Field of Classification Search
CPC .......... H05K 1/111; H05K 1/18; H05K 1/181; H05K 3/34; H05K 3/3442; H05K 3/3452;
(Continued)

(56) References Cited

U.S. PATENT DOCUMENTS 4,883,920 A * 11/1989 Tanabe ................. H05K 3/3442
228/180.1
5,683,788 A * 11/1997 Dugan ................. H05K 1/0295
428/209

(Continued)

FOREIGN PATENT DOCUMENTS

JP 2001-308503 A 11/2001
JP 2001308503 A * 11/2001
(Continued)

OTHER PUBLICATIONS

JP 2003243814 A (Year: 2021).*
(Continued)

*Primary Examiner* — Timothy J Thompson
*Assistant Examiner* — John B Freal
(74) *Attorney, Agent, or Firm* — Chip Law Group

(57) ABSTRACT

Provided is a land for a surface mounted component that includes a plurality of land regions respectively having different width. Land regions included in the plurality of land regions are combined with one another with centers in a width direction aligned in order conforming to the widths and are jointed into one land. A cutout shape is provided in a center in the width direction on a side opposed to an adjacent or overlapping side of a land region having a larger width of adjacent or partially overlapping two land regions in the plurality of land regions joined into the one land.

5 Claims, 10 Drawing Sheets

(52) U.S. Cl.
CPC ............. *H05K 2201/09727* (2013.01); *H05K 2203/048* (2013.01); *Y02P 70/50* (2015.11)

(58) Field of Classification Search
CPC .......... H05K 2201/09381; H05K 2201/09727; H05K 2201/09736; H05K 2201/09845; H05K 2201/09872; H05K 2201/0989; H05K 2201/099; H05K 2201/09909; H05K 2201/10636; H05K 2201/10651; H05K 2203/048; H01K 2201/09954
See application file for complete search history.

(56) References Cited

U.S. PATENT DOCUMENTS

| | | | | |
|---|---|---|---|---|
| 2003/0056975 | A1* | 3/2003 | Kochanowski | H05K 1/111 174/250 |
| 2008/0266824 | A1* | 10/2008 | Wang | H05K 3/3421 361/767 |
| 2011/0292625 | A1* | 12/2011 | Chen | H05K 1/0295 361/768 |

FOREIGN PATENT DOCUMENTS

| | | | | |
|---|---|---|---|---|
| JP | 2003-234567 | A | | 8/2003 |
| JP | 2003-243814 | A | | 8/2003 |
| JP | 2003234567 | A | * | 8/2003 ............... H05K 3/34 |
| JP | 2003243814 | A | * | 8/2003 |
| WO | WO-2017040967 | A1 | * | 3/2017 ............. H01L 21/50 |

OTHER PUBLICATIONS

JP 2003234567 A (Year: 2021).*
JP 2001308503 A (Year: 2021).*
International Search Report and Written Opinion of PCT Application No. PCT/JP2019/032198, dated Oct. 8, 2019, 07 pages of ISRWO.

* cited by examiner

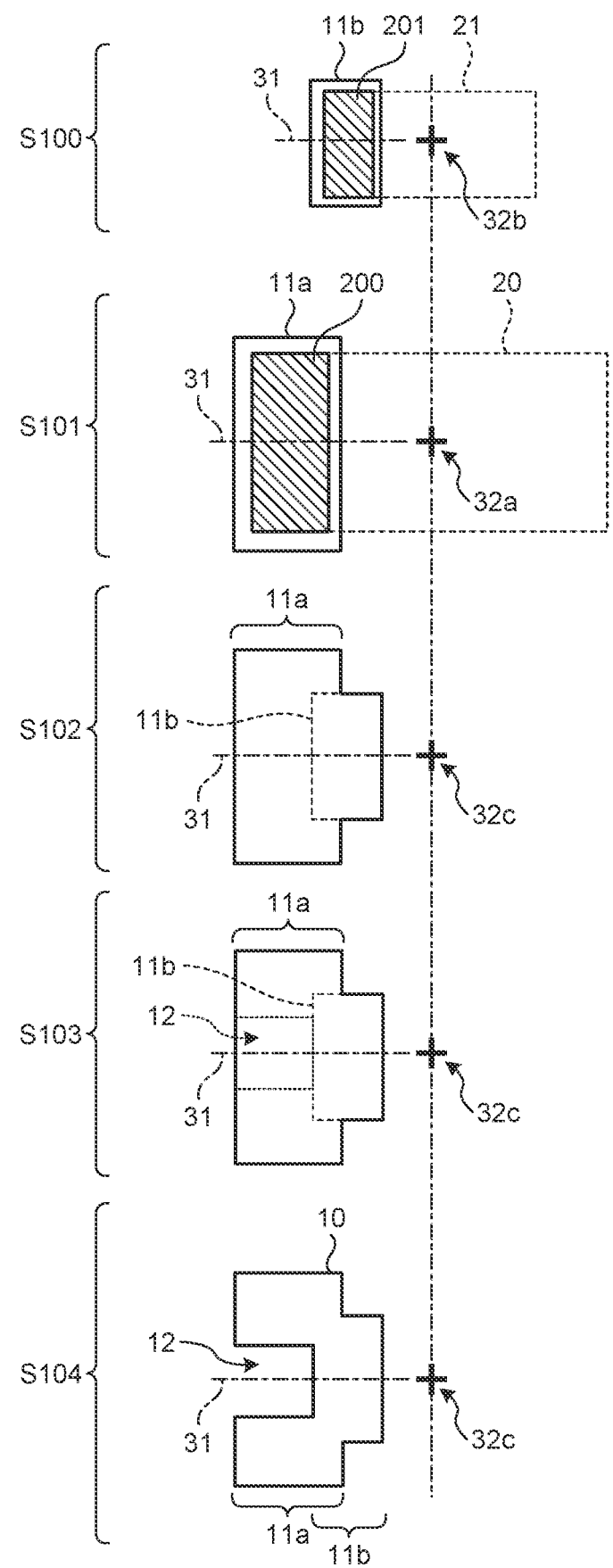

LAND FOR SURFACE MOUNTED COMPONENT

CROSS REFERENCE TO RELATED APPLICATIONS

This application is a U.S. National Phase of International Patent Application No. PCT/JP2019/032198 filed on Aug. 16, 2019, which claims priority benefit of Japanese Patent Application No. JP 2018-157693 filed in the Japan Patent Office on Aug. 24, 2018. Each of the above-referenced applications is hereby incorporated herein by reference in its entirety.

FIELD

The present invention relates to a land for a surface mounted component.

BACKGROUND

In design of printed board wiring, specifications such as sizes of chip components surface-mounted on the printed board are sometimes changed after the design. In this case, correction of wires including a size change of a land for surface-mounting the chip components is necessary. Therefore, in order to reduce cost for the correction after the design, a land shape made adaptable to a plurality of component sizes in advance has been proposed.

For example, in the case of a land adaptable to different two component sizes, a land having a shape obtained by combining, in a convex shape, a land corresponding to a small component of the two components and a land corresponding to a large component has been proposed. A pair of lands having the shape is disposed to be opposed such that a portion corresponding to the small component is on the inner side and a portion corresponding to the large component is on the outer side (for example, Patent Literature 1 and Patent Literature 2).

CITATION LIST

Patent Literature

Patent Literature 1: JP 2001-308503 A
Patent Literature 2: JP 2003-243814 A

SUMMARY

Technical Problem

When the components are mounted (soldered) on the land having the shape described above, a stable fillet shape can be obtained when the large component is mounted. On the other hand, when the small component is mounted, since a soldered portion on the distal end side of an electrode is long, force toward the outer side of the electrode acting during dissolution of heated solder. It is likely that deficiencies such as solder unjoining and component standing occur.

An object of the present disclosure is to provide a land for a surface mounted component adapted to mounting of components of a plurality of sizes and capable of suppressing deficiencies of component mounting.

Solution to Problem

For solving the problem described above, a land for a surface mounted component according to one aspect of the present disclosure has a plurality of land regions respectively having different width, wherein land regions included in the plurality of land regions are combined with one another with centers in a width direction aligned in order conforming to the widths and are jointed into one land, and a cutout shape is provided in a center in the width direction on a side opposed to an adjacent or overlapping side of a land region having the larger width of adjacent or partially overlapping two land regions in the plurality of land regions joined into the one land.

BRIEF DESCRIPTION OF DRAWINGS

FIG. 3 is a diagram for explaining a method of forming the land according to the embodiment.

DESCRIPTION OF EMBODIMENTS

Figure 1:
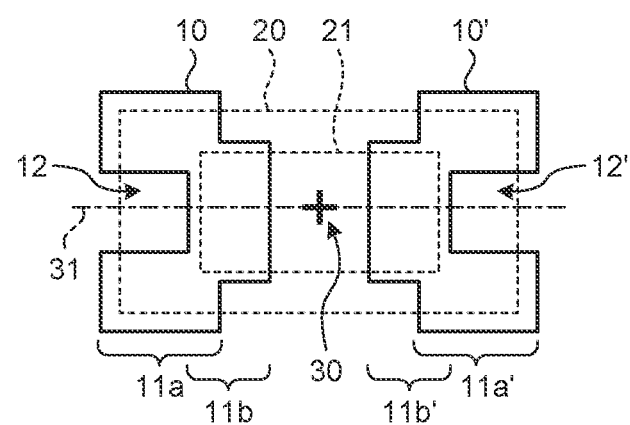
FIG. 1 is a diagram illustrating a configuration of an example of a land for a surface mounted component according to an embodiment.

An embodiment of the present disclosure is explained in detail below based on the drawings. Note that, in the embodiment explained below, redundant explanation is omitted by denoting the same parts with the same reference numerals and signs.

Land Shape According to Embodiment

FIG. 1 is a diagram illustrating a configuration of an example of a land for a surface mounted component according to the embodiment. In FIG. 1, a state in which lands 10 and 10' for a surface mounted component according to the embodiment are disposed on a substrate is illustrated. The land 10 according to the embodiment includes land regions 11a and 11b. An inhibition region 12 is formed by a cutout shape in the land region 11a. The land regions 11a and 11b are respectively formed by conductor films by conductors for solderable metal wiring subjected to surface treatment such as copper, silver, gold, or aluminum. In contrast, the inhibition region 12 is a region where soldering is inhibited. In the example illustrated in FIG. 1, the inhibition region 12 is formed by cutting out a part of the land region 11a.

The land region 11a has a size corresponding to an electrode width of a surface mounted component 20 having a first size indicated by a dotted line in FIG. 1. The size of the land region 11a indicates a size including the inhibition region 12. The land region 11b has a size corresponding to an electrode width of a surface mounted component 21 having a second size, which is also indicated by a dotted line in FIG. 1, smaller than the first size.

The land regions 11a and 11b are combined according to the sizes thereof such that, when the land 10 and the land 10' forming a pair with the land 10 are disposed on a substrate in a predetermined manner, a smaller region is disposed toward a middle point 30 of the lands 10 and 10' in a part closer to the middle point 30. In the example illustrated in FIG. 1, in the land 10, the land regions 11a and 11b are disposed in the order of the land region 11b and the land region 11a from a part closest to the middle point 30 and are joined as one land 10.

Note that, in FIG. 1 and subsequent similar figures, it is assumed that electrode widths of electrodes of the surface mounted components 20 and 21 indicate lengths in a latitudinal direction in the figures. Lengths in a longitudinal direction of the electrodes are referred to as electrode lengths. The land regions 11a and 11b are respectively designed in sizes having predetermined margins with respect to the electrode widths and the electrode lengths of the electrodes of the surface mounted components 20 and 21 corresponding to the land regions 11a and 11b.

The surface mounted components 20 and 21 are so-called chip components including soldered electrodes on both end sides in the longitudinal direction in the figures and are, specifically, a chip-type laminated ceramic capacitor, a chip-type laminated inductor, a chip ferrite bead, or a chip-type resistor. In the following explanation, unless specifically described otherwise, the surface mounted component 20 and the surface mounted component 21 are respectively described as chip component 20 and chip component 21.

The land 10' is paired with the land 10 and has the same configuration as the configuration of the land 10 and is disposed on the substrate to be directed in a direction opposed to the land 10. In the land 10', land regions 11a' and 11b' are respectively correspond to the land regions 11a and 11b of the land 10. Similarly, an inhibition region 12' corresponds to the inhibition region 12 of the land 10.

As illustrated in FIG. 1, a pair of lands 10 and 10' are disposed on the substrate with the land region 11b and the land region 11b' opposed to each other. At this time, the lands 10 and 10' are disposed on the substrate such that, when a center coordinate for component mounting in the chip components 20 and 21 are aligned with the middle point 30 of the lands 10 and 10', electrodes at both ends of the chip component 20 are respectively disposed in predetermined positions of the land regions 11a and 11a' and electrodes at both ends of the chip component 21 are respectively disposed in predetermined positions of the land regions 11b and 11b'.

That is, the land 10 is formed such that electrode width directions of the respective land regions 11a and 11b are parallel and centers in the electrode width directions of the land regions 11a and 11b are placed on a line 31 (hereinafter referred to as center line 31) perpendicular to the electrode width directions.

Figure 2A:
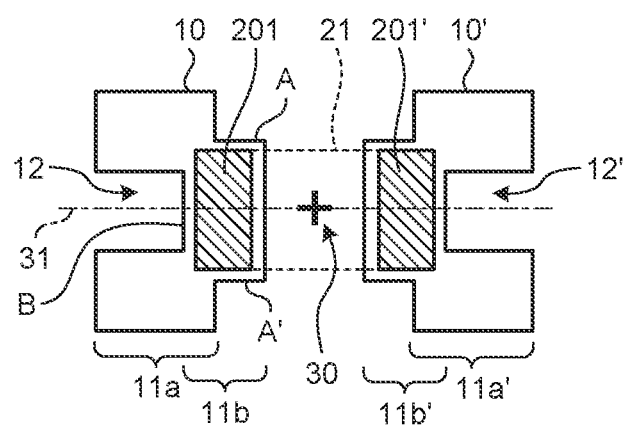
FIG. 2A is a diagram schematically illustrating a state in which a small chip component is mounted on the land.

FIG. 2A is a diagram schematically illustrating a state in which the small chip component 21 is mounted on the lands 10 and 10'. It is seen that electrode portions 201 and 201' at both ends in the longitudinal direction of the chip component 21 are respectively placed on the land regions 11b and 11b'.

In soldering of the electrode portions 201 and 201', for example, in the land 10, in sides A and A', behavior in the width direction of the chip component 21 (the electrode portion 201) during solder melting is suppressed and force for returning the electrode portion 201 to the center of the land region 11b acts. For example, in the land 10, in a side B relating to the inhibition region 12, behavior in the longitudinal direction of the chip component 21 (the electrode portion 201) during solder melting is suppressed and a force for returning the electrode portion 201 to the center of the land region 11b acts. These behaviors are called self-alignment.

Figure 2B:
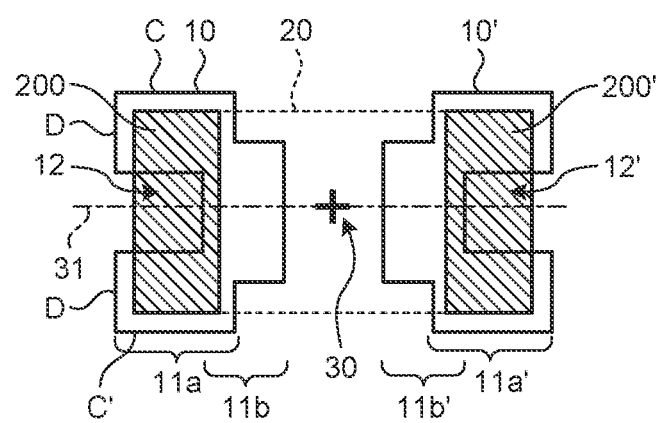
FIG. 2B is a diagram schematically illustrating a state in which a large chip component is mounted on the land.

FIG. 2B is a diagram schematically illustrating a state in which the large chip component 20 is mounted on the lands 10 and 10'. It is seen that electrode portions 200 and 200' at both ends in the longitudinal direction of the chip component 20 are respectively placed on the land regions 11a and 11a'.

In soldering of the electrode portions 200 and 200', for example, in the land 10, in sides C and C', behavior in the width direction of the chip component 20 (the electrode portion 200) during solder melting is suppressed and force for returning the electrode portion 200 to the center of the land region 11a acts. For example, in the land 10, in a side D, behavior in the longitudinal direction of the chip component 20 (the electrode portion 200) during solder melting is suppressed and force for returning the electrode portion 200 to the center of the land region 11a acts.

In this way, the land 10 according to the embodiment can suppress, for both of the chip components 20 and 21 of different sizes, unstable force during solder wet behavior in the electrode width direction and the longitudinal direction of the components. It is possible to perform high-quality soldering.

FIG. 3 is a diagram for explaining a method of forming the land 10 according to the embodiment. Note that, in FIG. 3, step S100 to step S104 are steps for convenience of explanation of the method of forming the land 10 and do not indicate actual formation procedure of the land 10.

Step S100 illustrates an example of the land region 11b for the small chip component 21. The land region 11b is set to a size having a predetermined margin with respect to the electrode portion 201 of the chip component 21. Similarly, step S101 illustrates an example of the land region 11a for the large chip component 20. The land region 11a is set to a size having a predetermined margin with respect to the electrode portion 200 of the chip component 20.

Step S102 illustrates an example of a state in which the land regions 11a and 11b are combined. A coordinate 32c indicates a coordinate on which a center coordinate 32b of the chip component 21 and a center coordinate 32a of the chip component 22 are matched. The coordinate 32c corresponds to the middle point 30 of the land 10, in which the land regions 11a and 11b are combined, and the land 10' paired with the land 10.

As illustrated in step S102, the land regions 11a and 11b are combined while keeping a relation between the distance from the center coordinate 32b to the land region 11b and the distance from the center coordinate 32a to the land region 11a and aligning the centers in the electrode width directions of the land regions 11a and 11b with the center line 31. The land regions 11a and 11b are combined so that the land regions 11a and 11b are set adjacent to each other or a part of the regions is caused to overlap.

Step S103 and step S104 illustrate an example in which a cutout shape is provided for a configuration in which the land regions 11a and 11b are combined and the inhibition region 12 is formed by the cutout shape. In the example illustrated in step S103, the inhibition region 12 is provided at width smaller than the width of the land region 11b in the electrode width direction. In the longitudinal direction of the chip component (the chip component 21), the inhibition region 12 is provided at length from the end of the land region 11a opposed to the coordinate 32c (the left end of the land region 11a in FIG. 3) to the end of the land region 11b opposed to the coordinate 32c (the left end of the land region 11b in FIG. 3). Step S104 illustrates an example of a shape of the land 10 in which the inhibition region 12 is formed for the configuration in which the land region 11a and the land region 11b are combined.

Figure 4:
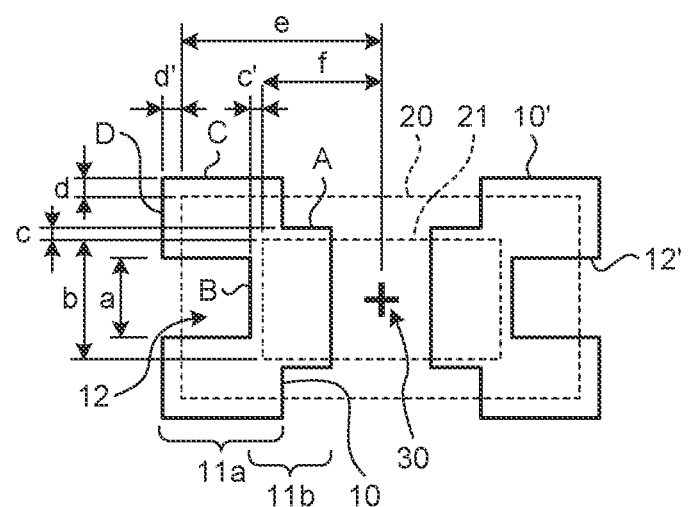
FIG. 4 is a diagram for explaining an example of sizes of sections of the land according to the embodiment.

FIG. 4 is a diagram for explaining an example of sizes of the sections of the land 10 according to the embodiment. Width a in the electrode width direction of the inhibition region 12 formed by the cutout shape for the land region 11a is set shorter than an electrode width b of the chip component 21 corresponding to the land region 11b. By setting the width a shorter than the electrode width b, it is possible to provide an escape route of excess solder during solder melting when the chip component 21 is mounted. As a specific example, the width a is set to approximately ⅓ to ⅘ of the electrode width b.

A distance c between the end in the electrode width direction of the chip component 21 and the side A corresponding to the land region 11b and a distance c' between the end in the longitudinal direction of the chip component 21 and the side B corresponding to the land region 11b are set to a known distance (0.1 mm or the like) considered preferable for imparting a self-aligning property to the chip component 21 during soldering. Similarly, a distance d between the end in the electrode width direction of the chip component 20 corresponding to the land region 11a and the side C corresponding to the land region 11a and a distance d' between the end in the longitudinal direction of the chip component 20 and the side D corresponding to the land region 11a is set to the known distance considered preferable for imparting a self-aligning property to the chip component 20 during soldering.

A distance e between the middle point 30 and the end in the longitudinal direction of the chip component 20 at the time when the land 10 and the land 10' paired with the land 10 are disposed on the substrate to enable the chip components 20 and 21 to be mounted and a distance f between the middle point 30 and the end in the longitudinal direction of the chip component 21 are respectively distances corresponding to lengths in the longitudinal direction of the respective chip components 20 and 21. Therefore, if the chip components 20 and 21 are determined, a shape of the land 10 and sizes of the sections of the land 10 can be uniquely determined.

In the above explanation, the chip components 20 and 21 having two kinds of sizes are enabled to be mounted by the same land 10 (and the land 10'). Examples (1) to (5) of combinations of the sizes of the chip components 20 and 21 are described below. Note that, in the sizes, four-digit numbers such as "0402" and "0603" are abbreviations of standard sizes of chip components specified by Japanese industrial standards (JIS).

Combination Example (1)
Chip component 21: 0402 (0.4×0.2 mm)
Chip component 20: 0603 (0.6×0.3 mm)
Combination Example (2)
Chip component 21: 0603 (0.6×0.3 mm)
Chip component 20: 1005 (1.0×0.5 mm) or 1106 (1.1×0.6 mm)
Combination Example (3)
Chip component 21: 1005 (1.0×0.5 mm) or 1106 (1.1×0.6 mm)
Chip component 20: 1608 (1.6×0.8 mm)
Combination Example (4)
Chip component 21: 1608 (1.6×0.8 mm) or 1709 (1.7×0.9 mm)
Chip component 20: 2012 (2.0×1.25 mm)
Combination Example (5)
Chip component 21: 2012 (2.0×1.25 mm)
Chip component 20: 3216 (3.2×1.6 mm)

Note that the combinations of the sizes of the chip components 20 and 21 are not limited to the combination examples (1) to (5) described above. Combinations of other sizes are also possible.

Comparison With Existing Technology

Figure 5:
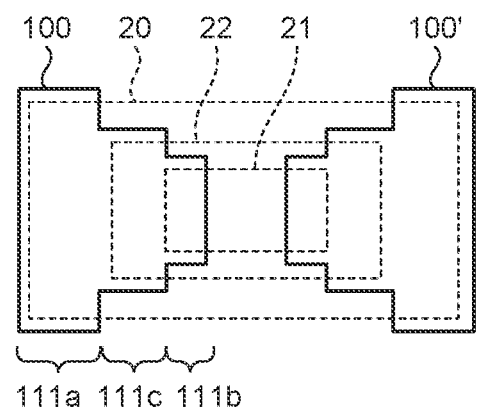
FIG. 5 is a diagram illustrating an example of a land adaptable to chip components of a plurality of sizes by an existing technology.

Subsequently, effects of the land 10 according to the embodiment are explained in comparison with an existing technology. FIG. 5 is a diagram illustrating an example of a land adaptable to chip components of a plurality of sizes by the existing technology (for example, Patent Literatures 1 and 2). In FIG. 5, a land 100 has a configuration in which a land region 111a corresponding to the chip component 20 of a large size, a land region 111b corresponding to the chip component 21 of a small size, and a land region 111c corresponding to a chip component 22 of an intermediate size of those sizes. A land 100' paired with the land 100 is the same. The land 100 is formed in a shape not including the inhibition region 12 in the land 10 according to the embodiment.

Figure 6:
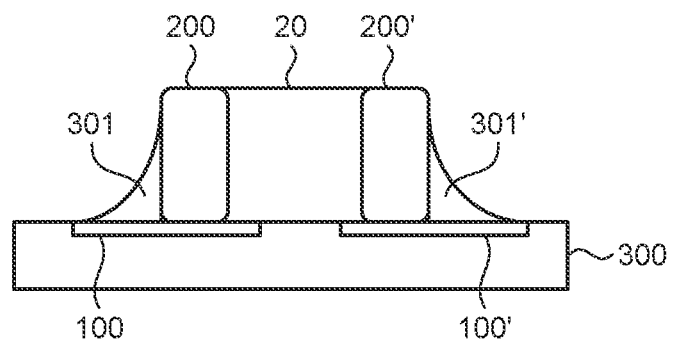
FIG. 6 is a diagram schematically illustrating a state in which a chip component of a large size corresponding to the land by the existing technology is mounted on the land.

Examples in which chip components are mounted on the shape of the land 100 illustrated in FIG. 5 are explained with reference to FIG. 6 and FIG. 7A to FIG. 7C. FIG. 6 is a diagram schematically illustrating a state in which the chip component 20 of a large size corresponding to the lands 100 and 100' by the existing technology are mounted, that is, soldered on the lands 100 and 100'. As illustrated in FIG. 6, when a rather large component, for example, the chip component 20 is soldered on the lands 100 and 100', a shape of solders 301 and 301' is a stable fillet shape. This indicates that stable soldering is performed.

Figure 7A:
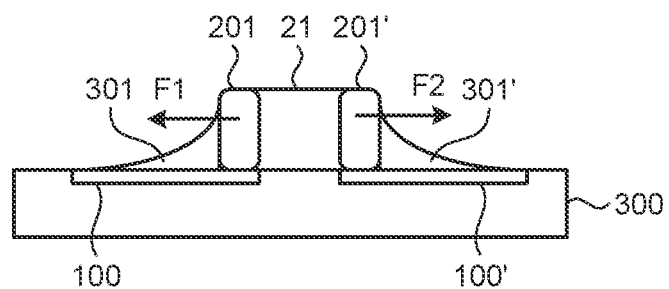
FIG. 7A is a diagram schematically illustrating a state in which a chip component of a small size corresponding to the land by the existing technology is soldered on the land.
Figure 7B:
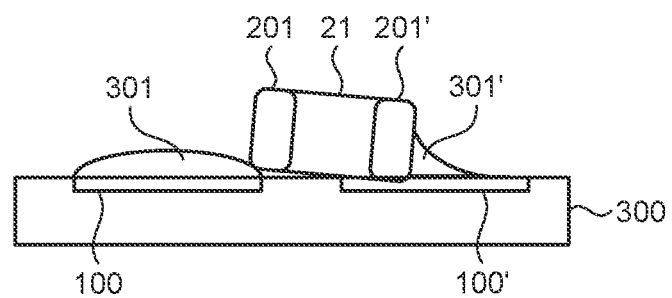
FIG. 7B is a diagram schematically illustrating a state in which the chip component of the small size corresponding to the land by the existing technology is soldered on the land.
Figure 7C:
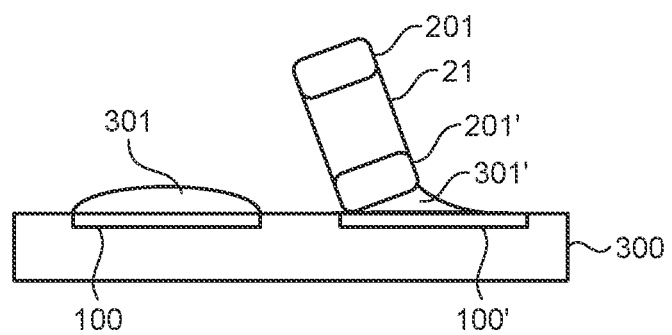
FIG. 7C is a diagram schematically illustrating a state in which the chip component of the small size corresponding to the land by the existing technology is soldered on the land.

FIG. 7A to FIG. 7C are diagrams schematically illustrating a state in which the chip component 21 of a small size corresponding to the lands 100 and 100' by the existing technology is soldered on the lands 100 and 100'. As illustrated in FIG. 7A, when a rather small component, for example, the chip component 21 is soldered on the lands 100 and 100', soldered portions on the distal end sides of the electrode portions 201 and 201' of the chip component 21 are long with respect to the known distance considered preferable in soldering of a chip component. Accordingly, during melting of the heated solders 301 and 301', forces F1 and F2 pulling solder toward longitudinal direction both end sides of the chip component 21 increase.

A difference between the forces F1 and F2 is a cause of instability of behavior of a component to be mounted. In addition to the difference between the forces F1 and F2, volume fluctuation at chip component both ends of a solder supply amount when performing soldering, fluctuation in a shift amount from a mounting target position during chip component mounting, a difference between solder melting timings in the lands 100 and 100' at the chip component both ends, and the like are also causes of the instability of the component behavior.

When the component behavior becomes unstable because of the soldering, solder unjoining illustrated in FIG. 7B and component standing illustrated in FIG. 7C easily occur. In an example illustrated in FIG. 7B, for example, since the force F2 is larger than the force F1, the chip component 21 is pulled in the direction of the land 100' and a state in which the electrode portion 201 is not sufficiently soldered on the land 100 occurs. In an example illustrated in FIG. 7C, for example, a difference between the force F2 and the force F1 is larger than the difference in the example illustrated in FIG. 7B. The chip component 21 is greatly pulled in the direction of the land 100' and the chip component 21 stands on a substrate 300.

In this way, in a land shape like the lands 100 and 100' illustrated in FIG. 5, it is likely that the quality of soldering is deteriorated when the small size chip component 21 or the medium size chip component 22 is mounted. In FIG. 5, an example is illustrated in which the same land 100 is adaptable to the three kinds of chip components 20, 21, and 22 having the different sizes. However, the same problem occurs when the same land 100 is adaptable to two kinds of chip components having different sizes. For example, in a chip-type laminated ceramic capacitor or a chip-type resistor, since the number of components in use per one substrate is large, shapes of the lands 100 and 100' corresponding to chip components of a plurality of sizes by the existing technology can be a cause of quality deterioration of a substrate on which the components are mounted.

In an example illustrated in FIG. 7A, the joining failures illustrated in FIG. 7B and FIG. 7C do not occur. However, in a long soldering dimension illustrated in FIG. 7A, breakage of a joined portion due to the influence of stress on a soldered portion due to repetition of rise and fall of temperature during product use easily occurs. Therefore, the shape of the land 100 is not considered a proper land shape.

Figure 8:
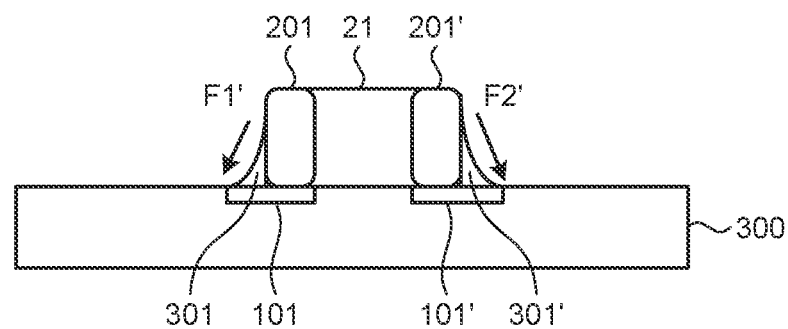
FIG. 8 is a diagram schematically illustrating a state in which a chip component is mounted on a general land formed to be adapted to a size of a single chip component.

FIG. 8 is a diagram schematically illustrating a state in which the chip component 21 is mounted on general lands 101 and 101' formed to match a size of the single chip component 21. In this case, for example, the distance between an end of the electrode portion 201 and an end of the land 101 of the chip component 21 is short. Forces F1' and F2' for pulling solder during solder melting act in a direction of the end of the land 101 from the height of the chip component 21. In this way, the direction of the forces F1' and F2' is different from the direction of the forces F1 and F2 in the case of the long soldering dimension illustrated in FIG. 7A. Therefore, the joining failures illustrated in FIG. 7B and FIG. 7C less easily occur.

The land 10 according to this embodiment is formed by combining the land regions 11a and 11b respectively corresponding to the electrode widths of the chip components 20 and 21 having the different sizes. At this time, the inhibition region 12 for inhibiting soldering is provided for the land region 11a. A soldering dimension in the land region 11b is reduced. Accordingly, a state of the chip component 21 mounted on the land region 11b can be made equivalent to a state of the chip component 21 mounted on the general lands 101 and 101' illustrated in FIG. 8. It is possible to perform stable soldering for the small size chip component 21.

Therefore, in a chip component of a general size (a component of a rectangular shape including two counter electrodes such as a chip-type laminated ceramic capacitor, a chip-type laminated inductor, a chip ferrite bead, a chip-type resistor, or a chip conductor), a plurality of chip components 20 and 21 having different sizes can be mounted in high quality by one land 10 according to the embodiment.

Accordingly, for example, chip components having the same characteristics and different sizes can be mounted by the same land 10. It is possible to properly use different components without changing substrate design. Further, an area of the land region 11b corresponding to the small chip component 21 is limited by the inhibition region 12. Therefore, it is possible to set an amount of solder printed in a reflow scheme to the same amount irrespective of a size of a chip component.

Furthermore, in the land 10 according to the embodiment, regions for imparting self-alignability are provided on distal end sides and side surface sides of the electrode portions 200 and 201 of the chip components 20 and 21 of adaptable sizes. In particular, an appropriate region can be provided for self-alignment by the inhibition region 12 on the distal end side of the electrode portion 201 of the small size chip component 21. Accordingly, it is possible to suppress occurrence of a joining failure when deviation during mounting of the chip components 20 and 21 occurs.

Like a layer-type ceramic capacitor, according to an increase in the capacity of a component, chip components having the same capacity and different sizes (standard sizes "0603" and "0704", standard sizes "1005" and "1106", standard sizes "1608" and "1709", and the like) are present. By using the land 10 according to the embodiment for such chip components having common characteristics and different sizes, it is possible to properly use a plurality of chip components having common characteristics and different sizes in one land 10.

Further, it could occur that a component mounted on the same land is changed to a component of a different type, for example, a capacitor is changed to a resistor or a resistor is changed to an inductor. Even in such a case, by using the land 10 according to the embodiment, it is possible to surely implement the change of the mounting. It is possible to relax restrictions in design.

Figure 9:
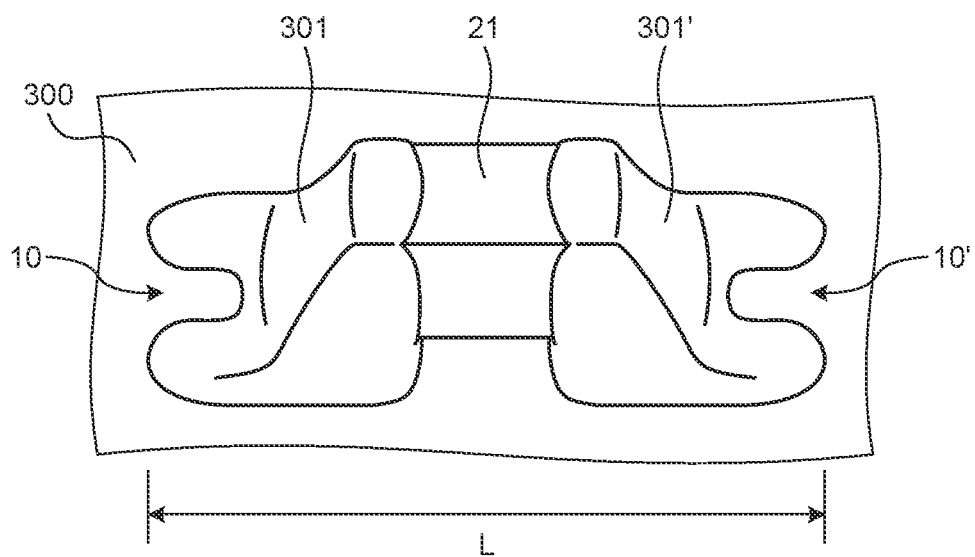
FIG. 9 is a diagram illustrating an experiment example in which a chip component is actually mounted on the land according to the embodiment.
Figure 10:
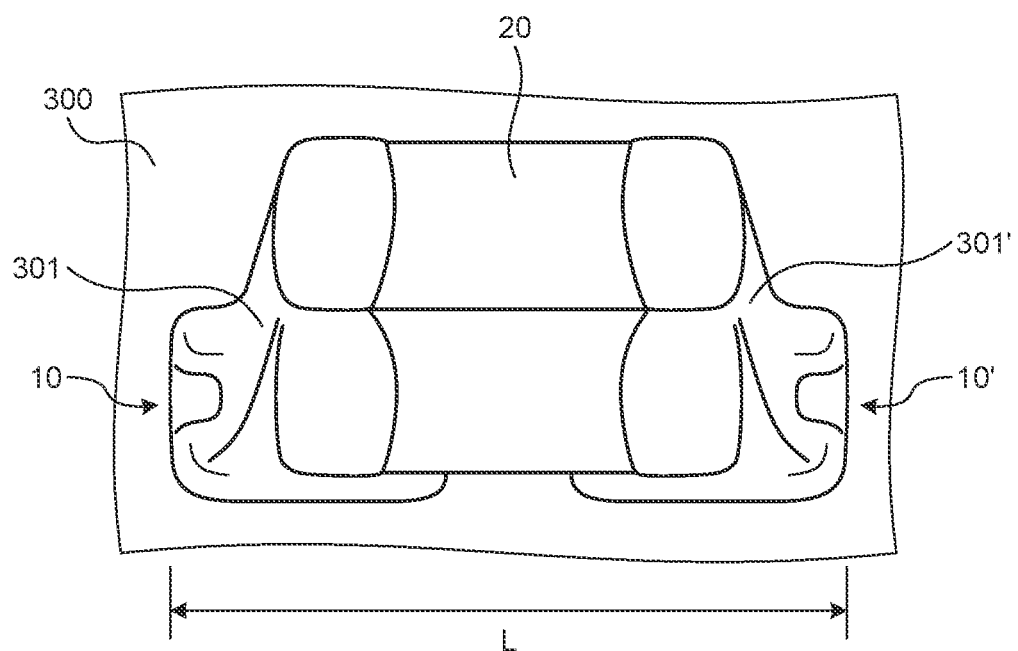
FIG. 10 is a diagram illustrating an experiment example in which a chip component is actually mounted on the land according to the embodiment.

FIG. 9 is a diagram illustrating an experiment example in which the chip component 21 is actually mounted on the lands 10 and 10' according to the embodiment. FIG. 10 is a diagram illustrating an experiment example in which the chip component 20 is actually mounted on the lands 10 and 10'. Note that, in FIG. 9 and FIG. 10, length L from the end of the land 10 to the end of the land 10' is illustrated as common. In the examples illustrated in FIG. 9 and FIG. 10, in the land 10 (and 10'), the land regions 11a and 11b are formed to correspond to two kinds of sizes of the standard sizes "0603" and "1005" by the combination example (2) explained above.

In the experiment example illustrated in FIG. 9, it is seen that soldering to the inhibition region 12 is inhibited. In the mounting of the chip component 21 illustrated in FIG. 9, it is seen that shapes of the solders 301 and 301' on both the end sides of the chip component 21 are stable fillet shapes. This indicates that stable soldering is performed.

In this experiment, it is confirmed that the joining failure due to the component standing illustrated in FIG. 7C can be suppressed even when the chip components 20 and 21 are heated and soldered in a state in which mounting deviation corresponding to the electrode widths of the chip components 20 and 21 (0.25 mm in the chip component 20 and 0.15 mm in the chip component 21) actually occurs.

Other Examples of Method of Forming Land According to Embodiment

Subsequently, other examples of the method of forming the land 10 according to the embodiment are explained. The lands 10 and 10' illustrated in FIG. 1 to FIG. 4 explained above are formed by removing, for example, portions other than the lands 10 and 10' of a conductor film on a substrate surface by etching or the like. This is not limited to this example. The lands 10 and 10' can also be formed by providing an insulating film for inhibiting soldering on the conductor film on the substrate surface.

Figure 11A:
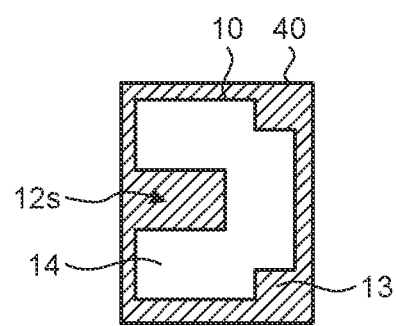
FIG. 11A is a diagram illustrating an example in which a land is formed using an insulating film applicable to the embodiment.
Figure 11B:
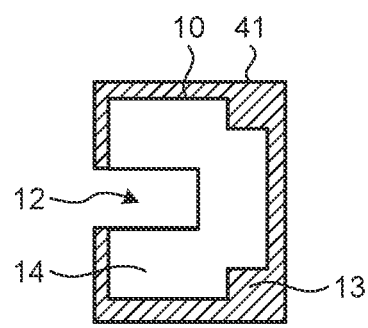
FIG. 11B is a diagram illustrating an example in which the land is formed using the insulating film applicable to the embodiment.
Figure 11C:
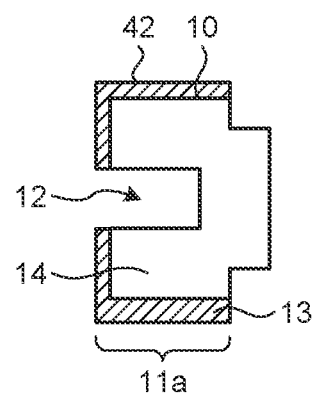
FIG. 11C is a diagram illustrating an example in which the land is formed using the insulating film applicable to the embodiment.

FIG. 11A to FIG. 11C are diagram illustrating an example in which the land 10 is formed using an insulating film applicable to the embodiment. As the insulating film, in general, a solder resist is used. Note that the land 10' paired with the land 10 is omitted in FIG. 11A to FIG. 11C because the land 10' has the same configuration as the configuration of the land 10.

FIG. 11A is a diagram illustrating an example in which a shape of the land 10 is formed by an insulating film 13 on a rectangular conductor film 40. That is, in a configuration illustrated in FIG. 11A, an exposed section 14 for performing soldering is formed in the land 10 by not coating the insulating film 13 on a region of the land 10. In the example illustrated in FIG. 11A, an inhibition region 12s is also formed by coating the insulating film 13 on the conductor film 40. That is, in the example illustrated in FIG. 11A, when viewed from the exposed section 14 side, the inhibition region 12s is formed by forming a cutout shape in the conductor film 40 with the insulating film 13.

FIG. 11B is a diagram illustrating an example in which a shape of the land 10 is formed by the insulating film 13 on the conductor film 41 in a state in which a portion of the inhibition region 12 is cutout in a rectangular conductor film. In the example illustrated in FIG. 11B, as in FIG. 11A explained above, the exposed section 14 is formed by not coating the insulating film 13 on the region of the land 10.

FIG. 11C is an example in which a conductor film is formed to be the shape of the land 10 in advance. In the example illustrated in FIG. 11C, a conductor film 42 is formed in a state in which a margin is imparted to a portion equivalent to the land region 11a in the shape of the land 10 and the insulating film 13 is coated on the margin portion to form the shape of the land 10. The inhibition region 12 is formed in a state in which the conductor film 42 is cut out as in the example illustrated in FIG. 11B.

Figure 12:
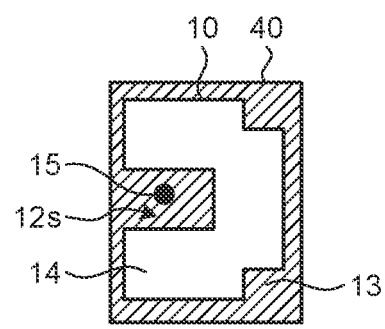
FIG. 12 is a diagram illustrating an example in which a through-hole is provided in an inhibition region according to the embodiment.

In the land 10 by FIG. 11A among FIG. 11A to FIG. 11C, the inhibition region 12 is formed by the insulating film 13. Therefore, it is difficult to apply the land 10 to a small chip component. This is because, when the small chip component is mounted on the land region 11b, it is likely that insulating film 13 coated on the inhibition region 12 peels. On the other hand, in the land 10 by FIG. 11A, the inhibition region 12 is formed integrally with the land 10 under the insulating film 13. Accordingly, as illustrated in FIG. 12, a through-hole 15 can be provided in the inhibition region 12. Consequently, flexibility of wiring is increased. It is possible to effectively use the substrate.

In the land 10 illustrated in FIG. 11C, an area of the insulating film 13 is small and the inhibition region 12 is formed by cutting out a conductor film. Therefore, the peeling of the insulating film 13 in the example illustrated in FIG. 11A less easily occurs. It is easy to mount the small chip component 21 of, for example, the standard size "0603".

Modification of Embodiment

Subsequently, a modification of the embodiment is explained. In the land 10 according to the embodiment explained above, the chip components 20 and 21 of two sizes can be mounted by one land 10. However, this is not limited to this example. That is, in the land according to the embodiment, chip components of three or more sizes can be mounted by one land.

Figure 13:
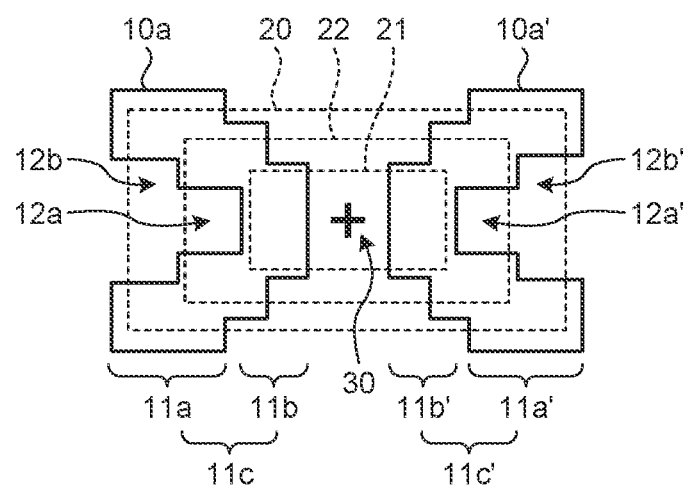
FIG. 13 is a diagram illustrating a configuration of an example of a land on which chip components of three sizes are mountable according to a modification of the embodiment.

FIG. 13 is a diagram illustrating a configuration of an example of a land that can mount chip components of three sizes according to the modification of the embodiment. In FIG. 13, a land 10a according to the modification of the embodiment has a configuration in which the land region 11a corresponding to the chip component 20 of a large size (electrode width), the land region 11b corresponding to the chip component 21 of a small size, and a land region 11c corresponding to the chip component 22 of an intermediate size of the large size and the small size are combined. Further, in the land 10a, an inhibition region 12a is formed by a cutout shape in the land region 11b and an inhibition region 12b is formed by a cutout shape in the land region 11c.

In the example illustrated in FIG. 13, as in FIG. 1 explained above, the land regions 11a, 11b, and 11c are combined according to sizes thereof such that, when the land 10a and a land 10a' paired with the land 10a are disposed on the substrate in a predetermined manner, a smaller land region is disposed in a part closer to the middle point 30 of the lands 10a and 10a' toward the middle point 30. In the example illustrated in FIG. 13, in the land 10a, the land regions 11a, 11b, and 11c are disposed in the order of the land region 11b, the land region 11c, and the land region 11a from a part closest to the middle point 30 and are joined as one land 10a.

Like the land 10a, the land 10a' paired with the land 10a includes land regions 11a', 11b', and 11c' respectively corresponding to the land regions 11a, 11b, and 11c and includes inhibition regions 12a' and 12b' respectively corresponding to the inhibition regions 12a and 12b.

For example, in the land 10a, the distance between the end on the land region 11c side of the inhibition region 12b and the end in the longitudinal direction of the chip component 22 in the case in which the chip component 22 is mounted on the land region 11c is set to a known distance considered preferable in order to impart a self-aligning property to the chip component 22 during soldering. Similarly, the distance in the electrode width direction of the chip component 22 corresponding to the land region 11c and the side of the land region 11c corresponding to the end is also set to the known distance considered preferable in order to impart a self-aligning property to the chip component 22 during soldering.

Note that, in the land 10a, the distances between ends of the chip component 20 and ends of the land region 11a and the distances between ends of the chip component 21 and ends of the land region 11b are the same as the distances explained with reference to FIG. 4. Therefore, explanation of the distances is omitted.

The lands 10a and 10a' according to the modification of the embodiment have such a configuration. Therefore, the chip components 20, 21, and 22 of the different sizes can be soldered under the same conditions by the pair of lands 10a and 10a'. The inhibition regions 12b and 12b' are provided for the land regions 11c and 11c' for mounting the chip component 22. Therefore, as in the embodiment explained above, in the mounting of the chip component 22, it is possible to suppress occurrence of joining failures such as the solder unjoining illustrated in FIG. 7B and the component standing illustrated in FIG. 7C.

By using the land 10a (and 10a') according to the modification of this embodiment, it is possible to properly use small chip components having high mounting difficulty such as the standard size "0402", "0603", and "1005".

Note that the effects described in this specification are only illustrations and are not limited. Other effects may be present.

Note that this technology can also take the following configurations.

(1) A land for a surface mounted component comprising
a plurality of land regions respectively having different width, wherein
land regions included in the plurality of land regions are combined with one another with centers in a width direction aligned in order conforming to the widths and are jointed into one land, and
a cutout shape is provided in a center in the width direction on a side opposed to an adjacent or overlapping side of a land region having the larger width of adjacent or partially overlapping two land regions in the plurality of land regions joined into the one land.

(2) The land for the surface mounted component according to (1), wherein
length in the width direction of the cutout shape is smaller than length in the width direction of a component corresponding to a land region having the smaller width of the two land regions.

(3) The land for the surface mounted component according to (1) or (2), wherein
the cutout shape is
provided by cutting out a conductor film of the larger land region.

(4) The land for the surface mounted component according to (1) or (2), wherein
the cutout shape is
provided by forming an insulating film in the larger land region.

REFERENCE SIGNS LIST 10, 10', 10a, 10a', 100, 100', 101, 101' LAND
11a, 11a', 11b, 11b', 11c, 11c', 111a, 111b, 111c LAND REGION
12, 12', 12a, 12b, 12s INHIBITION REGION
13 INSULATING FILM
14 EXPOSED SECTION
15 THROUGH-HOLE
20, 21, 22 CHIP COMPONENT
40, 41, 42 CONDUCTOR FILM
200, 200', 201, 201' ELECTRODE PORTION

The invention claimed is:

1. A land for a surface mounted component, the land comprising:
a plurality of land regions that includes a first land region and a second land region, wherein
the first land region has a width larger than a width of the second land region,
the first land region includes a first side and a second side,
the second side is opposite to the first side,
the first side is in contact with the second land region, and
a center of the first land region in a width direction of the land is aligned with a center of the second land region in the width direction;
a first cutout shape in a center in the width direction of the land, wherein the first cutout shape is on the second side of the first land region; and
an insulating film in the first cutout shape, wherein the insulating film in the first cutout shape includes a through hole.

2. The land for the surface mounted component according to claim 1, wherein
the first cutout shape has a length in the width direction smaller than a length in the width direction of a component, and
the component corresponds to the second land region.

3. The land for the surface mounted component according to claim 1, wherein the first cutout shape is inside the first land region.

4. The land for the surface mounted component according to claim 1, wherein
the plurality of land regions further includes a third land region, and
the third land region is larger than the second land region and smaller than the first land region.

5. The land for the surface mounted component according to claim 4, further comprising a second cutout shape in the third land region, wherein the second cutout shape is smaller than the first cutout shape.

* * * * *